United States Patent
Davids

(10) Patent No.: US 6,559,953 B1
(45) Date of Patent: May 6, 2003

(54) POINT DIFFRACTION INTERFEROMETRIC MASK INSPECTION TOOL AND METHOD

(75) Inventor: Paul S. Davids, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/572,978

(22) Filed: May 16, 2000

(51) Int. Cl.[7] .................................................. G01B 9/02
(52) U.S. Cl. ...................................... 356/521; 356/491
(58) Field of Search ............................. 356/521, 515, 356/511, 489, 491, 492, 495, 239.3, 237.3, 237.4

(56) References Cited

U.S. PATENT DOCUMENTS 5,933,236 A * 8/1999 Sommargren ................ 356/521
6,081,335 A * 6/2000 Seki ............................ 356/508

* cited by examiner

Primary Examiner—Samuel A. Turner
(74) Attorney, Agent, or Firm—George Chen

(57) ABSTRACT

The present invention comprises a tool for and a method of inspecting a mask used in photolithography to determine errors in phase, amplitude, and pattern edges. An embodiment of the tool comprises a laser source, a polarizing beam splitter, a first shutter, a mask, a second shutter, a quarter wave retarder, a single-mode optical fiber, and a CCD detector array. An embodiment of the method comprises four independent measurements of light intensity, comprising: a pattern of a mask, a diffraction pattern of a reference pinhole, an interference pattern of the mask and the reference pinhole, and an interference pattern of the mask and the reference pinhole with a known phase difference. Calculations are performed to determine phase and amplitude information as a function of location on the mask. The phase and amplitude information is then compared with a design layout of the mask to determine pattern edge information and identify possible defects in the mask.

29 Claims, 1 Drawing Sheet

POINT DIFFRACTION INTERFEROMETRIC MASK INSPECTION TOOL AND METHOD

BACKGROUND OF THE INVENTION

1. Field of the Invention

The present invention relates to the field of semiconductor integrated circuit manufacturing, and more specifically, to a tool for and a method of inspecting masks used in photolithography.

2. Discussion of Related Art

The manufacturing of integrated circuit (IC) devices involves the processing of a semiconductor wafer though sequential layers to add or remove material. Photolithography is used to pattern each layer on the wafer. The wafer is covered with photoresist which is a material that is sensitive to light. The photoresist is then selectively exposed with a mask in an exposure tool. An exposure tool may be a stepper, a scanner, or a contact printer. The photoresist is developed to form openings corresponding to the amount of light exposure. The photoresist acts as a stencil for transferring a pattern on the mask to the wafer through the process of etching.

IC manufacturing requires a total of 4 to 35 masks. A mask may be used for a critical layer of the IC such as isolation, gate, contact, or first metal. A mask may also be used for a non-critical layer requiring diffusion or ion implantation. The mask may be transmissive or reflective. The features may be magnified on the mask and then reduced back to the desired size by the exposure tool.

Conventional masks used in photolithography are made by patterning chrome that has been deposited on a quartz substrate. Such masks are binary since the amplitude of light is modulated by the opaque and transparent areas. However, when the minimum critical dimension (CD) becomes smaller than the exposure wavelength, the resolution of the images is degraded by the spreading effects of diffraction. Phase-shifting masks (PSMs) take advantage of destructive interference to minimize the detrimental effects of diffraction.

Systematic print biases and etch biases in the fabrication of wafers can affect image quality. Optical proximity effects are manifested as corner rounding, line shortening, and CD offset between nested features and isolated features. Optical proximity correction (OPC), based on models or rules, can be incorporated into binary masks and PSMs to compensate for repeatable image distortions. OPC involves the addition of sub-resolution features, such as serifs, assist slots, and scattering bars.

Masks using phase-shifting and OPC are complex and difficult to inspect. Inspection is necessary to ensure the fidelity of the masks. Patterns on the masks must meet stringent criteria for size, shape, spacing, orientation, overlap, and placement of features. Defects must be repaired to prevent replication of errors across the wafers.

Currently, masks are usually inspected with a scanning optical microscope. However, resolution is limited by wavelength of the illumination, numerical aperture of the condenser and collector lens, and aberrations in the optics. Phase information is lost since light intensity is integrated at each location on a mask.

Thus, what is needed is a tool for and a method of inspecting a mask used in photolithography to determine errors in phase, amplitude, and pattern edges with high resolution.

DETAILED DESCRIPTION OF THE PRESENT INVENTION

Figure 1:
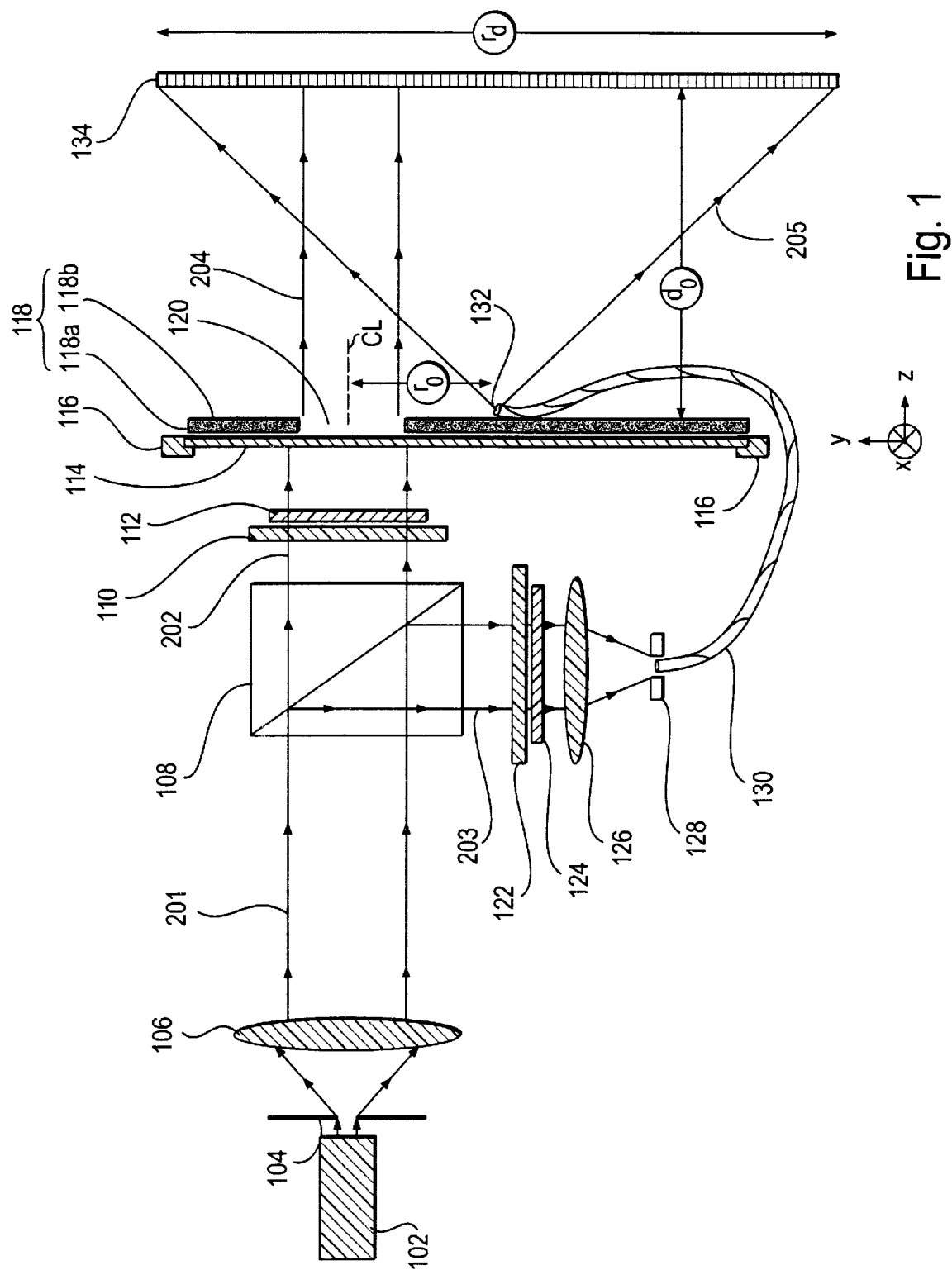
FIG. 1 is an illustration of an embodiment of an interferometric mask inspection tool according to the present invention.

In the following description, numerous particular details, such as specific materials, dimensions, and processes, are set forth in order to provide a thorough understanding of the present invention. However, one skilled in the art will realize that the invention may be practiced without these particular details. In other instances, well-known semiconductor equipment and processes have not been described in particular detail so as to avoid obscuring the present invention.

The present invention comprises a tool for and a method of inspecting masks used in photolithography. The inspection is performed using light with a central wavelength that is approximately the same as the actinic wavelength. The light is split into two linearly polarized beams which are orthogonal to each other and to the direction of propagation. The reference beam is an ideal spherical wave formed by diffraction through a pinhole. The test beam is a plane wave that has been transmitted through a transmissive mask or reflected through a reflective mask. The interaction between the reference beam and the test beam provides information about the phase, amplitude, and pattern edge of the mask. A very high resolution is possible since the inspection is only limited by the wavelength of light. Resolution is not limited by numerical aperture of a condenser or collector lens or by aberrations in the optics.

A tool for inspecting masks in accordance with an embodiment of the present invention will be described first. The masks may be transmissive or reflective. The masks may be binary or phase-shifting (PSM). The masks may incorporate optical proximity correction (OPC). The PSMs may be strong or weak: strong PSMs double the spatial frequency while weak PSMs enhance the edge contrast.

FIG. 1 shows an embodiment of the interferometric mask inspection tool of the present invention. The tool of the present invention uses an illumination source 102 to produce a first beam 201 of light which is substantially monochromatic, coherent, and collimated. The first beam of light 201 should have a narrow bandwidth with a central wavelength which is approximately the same as the actinic wavelength. The actinic wavelength is the wavelength at which a mask is used in a wafer stepper to expose photoresist on a wafer. It is desirable to inspect a mask 114 at the actinic wavelength. A more accurate gauge of the true quality of the mask 114 is obtainable at the actinic wavelength since the refractive index of a transparent material varies as a function of the wavelength of light. Approximate values for some actinic wavelengths, with typical illumination sources indicated within parentheses, include the following: 436 nm (g-line of Mercury lamp), 365 nm (i-line of Mercury lamp), 248 nm (KrF excimer laser), 193 nm (ArF excimer laser), 157 nm ($F_2$ excimer laser), and 126 nm ($Ar_2$ excimer laser).

The illumination source 102 may be a laser with a beam expander. Alternatively, the illumination source can be an arc lamp, for example, a Xe—Hg arc lamp or a deuterium (D2) lamp. A Xe—Hg arc lamp provides light with wavelengths of approximately 200 to 2500 nanometers. Deuterium lamps are arc lamps filled with deuterium. They operate at low pressure and, unlike arc lamps, emit only from one side and in one direction. Deuterium lamps provide light with wavelengths of approximately 160 to 400 nanometers. If the source light is polychromatic or broadband, a grating monochromator or an interference filter may be needed. Interference filters are made by depositing a series of layers of precisely controlled thicknesses of dielectrics and metals on a transparent substrate such as fused silica. If the source light is incoherent, a pinhole 2 may be used as a spatial coherence filter and a collimating lens 106 may be used to adjust the size of the beam.

The first beam 201 of light from the illumination source 102 is incident on a polarizing beam splitter 108, producing a second beam 202 of light and a third beam 203 of light. The second beam 202 of light and the third beam 203 of light are linearly polarized, orthogonal to each other, and orthogonal to the direction of propagation. A polarizing beam splitter 108 may be made from birefringent crystals, such as Calcite, which have been oriented and cleaved into two prisms and then cemented together at the hypotenuse. Calcite is a rhombohedral crystalline form of Calcium Carbonate ($CaCO_3$). If desired, the first beam 201 of light may be split and polarized separately. Beam splitters include transmission type diffraction gratings, reflection type diffraction gratings, half mirrors, double mirrors, and double pinholes. Polarizers may be constructed from plates of ground and polished fused silica with dichroic coatings. Dichroism is the selective absorption of one polarization plane over the other polarization plane during transmission through a material.

A first shutter 110 is used to transmit or block the second beam 202 of light. When transmitted, the second beam 202 of light is incident on a patterned area on one side of a mask 114. The mask 114 lies in a plane formed by an x-axis and a y-axis. The mask 114 is held in a mask holder 118. It is desirable that the second beam 202 of light be incident normally on the mask 114. Off-normal or oblique incidence may be used, but then the central wavelength may be shifted, the transmitted intensity may be reduced, and the bandwidth may be broadened. Oblique incidence will also cause the calculations for image reconstruction to become more complicated.

After being incident on the mask 114, the second beam 202 of light is incident on a field stop 118, producing a test beam 204 which is characteristic of the patterned area of the mask 114. The test beam 204 will be propagated towards a detector array 134 that is parallel to the mask 114 in the mask holder 116.

Stepping the mask 114 while leaving the second beam 202 and third beam 203 of light in fixed positions results in a simpler tool design. A motorized stage can move the mask holder 116 along the x-axis and the y-axis to vary the location where the second beam 202 of light is incident on the mask 114.

However, faster measurements can be achieved by leaving the mask 114 in a fixed position and scanning the second beam 202 of light, but then the second beam 202 of light, the third beam 203 of light, and the detector array 134 must be synchronized and moved in unison. The mechanism for scanning the second beam 202 of light along the x-axis and the y-axis can be identical or different. One possibility is to use an acoustic-optical modulator/deflector for the x-axis and a galvanometer-driven mirror for the y-axis.

A second shutter 122 can transmit or block the third beam 203 of light. When transmitted, the third beam 203 of light is incident on a reference pinhole 128, creating a diffraction-limited reference beam 205. The diameter of the reference pinhole 128 should approach the central wavelength of the light produced by the illumination source 102. As an example, the pinhole 128 may have a radius of 0.4 microns. The light passing though the reference pinhole 128 is not perturbed by any optical element so it closely approximates an ideal spherical wave. The third beam 203 of light bypasses the patterned area on one side of the mask 114 and emerges at the distal end 118b of the field stop 118 over an opaque area 132, becoming reference beam 205 which is then propagated towards the detector array 134.

The reference pinhole 128 may comprise a polarization-preserving optical fiber or a single-mode optical fiber 130. In such a case, a fiber-optic coupler 126 is used to couple the third beam 203 of light to the input end of the single-mode optical fiber 130. Then the output end of the single-mode optical fiber 130 is attached to the distal end 118b of the field stop 118 over an opaque portion 132.

A known phase difference between the second beam 202 of light and the third beam 203 of light can be introduced. The phase-shifting element 124 may be moved into or out of the path of the third beam 203 of light between the second shutter 122 and the reference pinhole 128. Alternatively, the phase-shifting element 124 may be moved into or out of the path of the second beam 202 of light between the first shutter 110 and the mask 114. Phase-shifting elements include waveplates, gratings, and mirrors.

It is desirable to use a first order quarter wave retarder as the phase-shifting element 124. A quarter wave retarder plate will shift the phase by a quarter wavelength or 90 degrees and simplify the calculations for image reconstruction. The phase difference is the amount of retardation of the slow ray by comparison with the fast ray at emergence from the plate. The refractive index of most materials is wavelength-dependent so the amount of retardation that accumulates within a plate of specified thickness is wavelength-dependent. The net retardation is essentially temperature-invariant. The quarter wave retarder has a fast axis that is aligned with a polarization axis of the third beam 203 of light. Either the crystalline optic axis or the axis normal to it is called the fast axis depending on whether the uniaxial crystal in the quarter wave retarder is positive or negative. A polarized plane wave will propagate along the fast axis with a maximum phase velocity since the index of refraction is at a minimum.

The size of the opening 120 in the field stop 118 may be adjusted to vary the size of the test beam 204. The opening 120 in the field stop 118 has a lateral dimension. The opening 120 should be large enough so that the test beam 204 is transmitted without significant spatial filtering or attenuation. It is desirable to choose a rectangular or square opening since the patterned area on the mask 114 is usually bounded by a rectangular or square frame. The front side of the detector array 134 also usually has a rectangular or square array of pixels. As an example, the field stop 118 may have an opening 120 of 40 microns×40 microns. However, other shapes, including circularly shaped openings, may be used as long as overlap regions on the mask 114 and on the detector array 134 are properly taken into account.

The intensity of the reference beam 205 is usually many orders of magnitude lower than the intensity of the test beam 204 because the reference pinhole 128 will attenuate the amplitude of the reference beam 205. It is desirable to try to match the intensities to within 1 or 2 orders of magnitude in order to improve visibility of the interference fringes. A neutral density filter 112 may be used with the first shutter 110 to reduce the amplitude of the test beam 204 so as to match the amplitude of the reference beam 205 more closely.

Neutral density filters attenuate light by reflection and absorption and may be made by depositing a thin layer of metal alloy on a transparent substrate such as fused silica.

A difference in path length exists between a test length, which is the sum of the second beam 202 and the test beam 204, and a reference length, which is the sum of the third beam 203 and the reference beam 205. The path length difference must be less than the coherence length of the illumination source 1. The coherence length of white light is about 1 micron which is too short to be useful. The coherence length for a single mode laser is about 1 kilometer which may be longer than necessary. It is desirable to minimize the path length difference as much as possible since then the coherence requirement for the illumination source 102 may be relaxed correspondingly.

The distal side 118b of the field stop 118 lies in a first plane oriented along the x-axis and the y-axis. The test beam 204 and the reference beam 205 will be close to each other at the first plane. The lateral offset, r (0), between the center of the test beam 204 and the center of the reference beam 205 can be varied along the x-axis and y-axis. The test beam 204 has characteristics of the patterned area on the mask 114 while the reference beam 205 is a diffraction-limited beam used as an ideal reference. The light in the test beam 204 and the light in the reference beam 205 will form a pattern of constructively and destructively interfering regions on a second plane formed by the front side of the detector array 134. The detector array 134 may comprise a two-dimensional array of charge-coupled devices (CCD). As an example, the CCD detector array may have an area of 7.5 mm×7.5 mm with a pixel area of 31 micron×31 micron. The z-axis is in the direction of the separation between the field stop 118 and the detector array 134. The separation, d (0), between the first plane and the second plane can be varied along the z-axis.

The lateral offset, r (0), between the center of the test beam 204 and the center of the reference beam 205 should be approximately 2 to 4 orders of magnitude smaller than the separation, d (0), between the field stop 118 and the detector array 134. As an example, r (0) may be 120 microns while d (0) may be 5 millimeters. The lateral dimension, r (d), of the detector array 134 should be at least approximately 25 percent smaller than the separation, d (0), between the field stop 118 and the detector array 134. The divergence of the reference beam 205 must be large enough to completely illuminate the detector array 134. In other words, the detector array must have sufficient angular size to collect most of the diffracted orders of light. Then the free space propagation condition for electromagnetic radiation will be satisfied and the detector array 134 may be considered to be in the far field relative to the mask 114 and the reference pinhole 128.

The interference fringe density should not exceed the spatial resolution of the detector array 134. Since the angular size of the detector array 134 and the number of pixels in the detector array 134 affect the pixel spacing, the pixel spacing can be adjusted as needed by increasing the working distance at the expense of the measured intensity in the detector array 134. The working distance is the separation d (0) between the field stop 118 and the detector array 134.

The polarizing beam splitter 108, the phase-shifting element 124, the single mode optical fiber 130, and the detector array 134 should be specified for light of approximately the central wavelength of the illumination source 102. The polarizing beam splitter 108, the phase-shifting element 124, the single mode optical fiber 130, and the detector array 134 should produce minimal wavefront distortion. A sufficiently high damage threshold to withstand the maximum power of the illumination source 102 is also necessary. Characteristics of optical components often vary with temperature. Permanent damage leading to complete destruction may occur if the heat load is not reduced by using appropriate filters and mirrors. Thermal shock should be avoided by keeping thermal ramp rates under 5 degrees C. per minute.

A method of inspecting masks in accordance with an embodiment of the present invention will be described next.

Four independent measurements of light intensity are taken to quantify how each location of the mask 114 has modified the light in transmission for a transmissive mask and in reflection for a reflective mask. The measurements are recorded on a detector array 134. The four measurements for each desired location of the mask 114 should be taken over as short a time period as possible so they will not be affected by fluctuations in the illumination source 102. The four measurements, which may be taken in any order, are as follows:

(a) with the first shutter 110 open and the second shutter 122 closed, take a first measurement, $I_1$, of a patterned area on a mask 114;

(b) with the first shutter 110 closed, the second shutter 122 open, and the quarter wave retarder 124 out of the light path, take a second measurement, $I_2$, of a diffraction pattern of the reference pinhole 128;

(c) with the first shutter 110 open, the second shutter 122 open, and the quarter wave retarder 124 moved out of the light path, take a third measurement, $I_3$, of an interference pattern or interferogram formed from the patterned area on the mask 114 and the reference pinhole 128 without a phase shift; and (d) with the first shutter 110 open, the second shutter 122 open, and the quarter wave retarder 124 moved into the light path, take a fourth measurement, $I_4$, of an interferogram formed from the patterned area on the mask 114 and the reference pinhole 128 with a phase shift.

If desired, smoothing of the raw data may be performed, such as by using a 3×3 low pass Gaussian filter. Smoothing of the amplitude and the phase may also be performed, such as by using a 6×oversampling. Interpolation can provide details in locations of the mask 114 that are off the sample grid of points where measurements are taken.

The complex mask transmission function is reconstructed numerically using Fast Fourier transforms. Calculations are performed to determine phase, $\phi$, and amplitude, f, as a function of location on the mask 114.

$$\cos(\phi-\delta)=[I_3-I_1-I_2]/[2\times\text{square root}[I_1 \times I_2]] \quad \text{(equation 1)}$$

$$\sin(\phi-\delta)=[I_4-I_1-I_2]/[2\times\text{square root}[I_1 \times I_2]] \quad \text{(equation 2)}$$

$$\tan(\phi-\delta)=[I_4-I_1-I_2]/[I_3-I_1-I_2] \quad \text{(equation 3)}$$

The phase, $\phi$, of the complex Fourier transform of the mask transmission function is determined uniquely from the measured interferograms, $I_3$ and $I_4$, where $\delta$ is the phase of the reference beam 205. The phase wrapping problem is solved since the sine and the cosine are independently measured to determine the quadrant of the phase angle, $\phi$, thus removing the sign ambiguity.

$$\phi=\delta+\arctan[[I_4-I_1-I_3]/[I_3-I_1-I_2]] \quad \text{(equation 4)}$$

The amplitude is determined by multiplying the square root of $I_1$ by the separation, d (0), between the field stop 118 and the detector array 134.

$$f=d(0)\times\text{square root}[I_1] \quad \text{(equation 5)}$$

The phase and amplitude information is compared with a design layout of the patterned area of the mask 114 to determine pattern edge information and identify possible defects. Any discrepancy in phase, amplitude, or pattern edge detected in the patterned area of the mask 114 would be considered a possible defect. It is possible to zoom into any potential defect to obtain more detail as needed. Variation in absorption, reflectivity, and transmittance across the patterned area of the mask 114 may affect the measurements. If the thickness of a transparent material is known, the refractive index and the absorption coefficient or extinction coefficient of the transparent material may be determined from the phase and amplitude information.

The tool does not use any lenses or mirrors between the mask 114 and the light detector array 134 so as to prevent introduction of aberrations into the test beam 204. The tool also does not use any lenses or mirrors between the distal end 118b of the field stop 118 and the detector array 134 so as to prevent the introduction of aberrations into the reference beam 205. Consequently, a very high resolution is achievable since the measurement is only limited by the central wavelength of the illumination source 102. Very small features within the patterned area on a mask 114 can be characterized. As an example, a defect of less than about 0.75 micron×0.75 micron can be measured using a laser with a central wavelength of 0.248 microns.

Depending on the size of the test beam 204 of light, the minimum feature size in the patterned area of the mask 114, the lateral dimension, r (d), of the detector array 134, and the size of the pixel in the detector array 134, it may be necessary to divide the mask 114 into many separate locations and measure each location separately. A tradeoff needs to be established between the desired resolution and the acceptable measurement speed when characterizing the entire patterned area of a mask 114. If desired, only critical locations may be inspected.

Many alternative embodiments and numerous particular details have been set forth above in order to provide a thorough understanding of the present invention. One skilled in the art will appreciate that many of the features in one embodiment are equally applicable to other embodiments. One skilled in the art will also appreciate the ability to make various equivalent substitutions for those specific materials, processes, dimensions, concentrations, etc. described herein. It is to be understood that the detailed description of the present invention should be taken as illustrative and not limiting, wherein the scope of the present invention should be determined by the claims that follow.

Thus, we have described a tool and a method of inspecting a mask used in photolithography to determine errors in phase, amplitude, and pattern edges with high resolution.

I claim:

1. An apparatus for inspecting a mask comprising:
    an illumination source to produce a first beam of light which is substantially monochromatic, coherent, and collimated;
    a first element to polarize and separate said first beam into a second beam and a third beam;
    a first mechanism to regulate transmission of said second beam;
    a mask to produce a test beam from said second beam;
    a second mechanism to regulate transmission of said third beam;
    a second element to introduce a phase difference between said second beam and said third beam;
    a pinhole to produce a reference beam from said third beam; and
    a sensing device to record intensity of said test beam and said reference beam.

2. The apparatus of claim 1 wherein said first beam comprises a wavelength that is approximately the same as an actinic wavelength at which said mask is to be used.

3. The apparatus of claim 1 wherein said second beam of light and said third beam of light are linearly polarized, orthogonal to each other, and orthogonal to a direction of propagation.

4. The apparatus of claim 1 further comprising a third mechanism to hold said mask such that said second beam of light is incident on and normal to a location on a patterned area on one side of said mask.

5. The apparatus of claim 1 further comprising a third mechanism to vary said location where said second beam of light is incident on and normal to said mask.

6. The apparatus of claim 1 further comprising a field stop, wherein said field stop has a proximal side and a distal side, said proximal side being adjacent to said mask, said field stop having an opening surrounded by an opaque portion, said opening having a center and a first lateral dimension, said first lateral dimension of said opening being adjustable, said second beam being incident on and normal to said proximal side, said second beam being centered on said opening, and said second beam being larger than said first lateral dimension of said opening in said field stop.

7. The apparatus of claim 1 wherein said second element has a fast axis that is aligned with a polarization axis of said third beam.

8. The apparatus of claim 1 wherein said second element introduces a known phase difference between said second beam and said third beam.

9. The apparatus of claim 1 wherein said pinhole comprises a single-mode optical fiber with an input end attached to a fiber-optic coupler and an output end attached to said distal side of said field stop over said opaque portion.

10. The apparatus of claim 1 further comprising a third mechanism to vary a path length difference between a test length and a reference length, wherein said test length comprises said second beam and said test beam, and wherein said reference length comprises said third beam and said reference beam, such that said path length difference is much less than a coherence length of said first beam.

11. The apparatus of claim 1 further comprising a third mechanism to vary a lateral offset between a center of said reference beam and said center of said opening in said field stop where said test beam emerges.

12. The apparatus of claim 11 wherein said lateral offset is approximately 2 to 4 orders of magnitude smaller than a separation between a first plane and a second plane, said first plane being at said distal side of said field stop, said second plane being at a front side of said sensing device, said first plane and said second plane being parallel to each other.

13. The apparatus of claim 12 further comprising a third mechanism to vary said separation between said first plane and said second plane.

14. The apparatus of claim 12 wherein a second lateral dimension of said sensing device is at least approximately 25 percent smaller than said separation between said first plane and said second plane.

15. An apparatus for inspecting a mask comprising:
    a laser source to produce a first beam of light;
    a polarizing beam splitter disposed in a path of said first beam to produce a second beam and a third beam;
    a first shutter disposed in a path of said second beam;
    a mask holder, said mask holder to hold a mask, said mask to produce a test beam when disposed in a path of said second beam;

a second shutter disposed in a path of said third beam;

a quarter wave retarder to shift phase by 90 degrees when disposed in a path of said second beam or a path of said third beam;

a single-mode optical fiber to produce a reference beam when coupled to said third beam; and a CCD detector array disposed in a path of said test beam and a path of said reference beam to record an intensity of light.

16. The apparatus of claim 15 wherein said first beam comprises a wavelength that is approximately the same as an actinic wavelength at which said mask is to be used.

17. The apparatus of claim 15 wherein said mask comprises a transmissive mask.

18. The apparatus of claim 15 wherein said mask comprises a binary mask.

19. The apparatus of claim 15 wherein said mask comprises a phase-shifting mask.

20. The apparatus of claim 15 wherein said mask comprises optical proximity correction.

21. The apparatus of claim 15 wherein said mask comprises a reflective mask.

22. A method of inspecting a mask comprising:

producing a first beam and a second beam of light, said first beam and said second beam being substantially monochromatic, coherent, collimated, linearly polarized, and orthogonal to each other and a direction of propagation;

taking four measurements of light intensity, in any order, resulting from: exposing said mask by itself to said first beam;

exposing a pinhole by itself to said second beam;

exposing said mask to said first beam and said pinhole to said second beam, without any phase shift, to create a first interferogram;

exposing said mask to said first beam and said pinhole to said second beam, with a known phase shift, to create a second interferogram;

calculating phase and amplitude information from said four measurements; and comparing said phase and amplitude information with a design layout of said mask to determine pattern edge information and identify possible defects in said mask.

23. The method of claim 22 wherein said four measurements are taken at a wavelength that is approximately the same as an actinic wavelength at which said mask is to be used.

24. The method of claim 22 wherein said mask comprises a transmissive mask.

25. The method of claim 22 wherein said mask comprises a binary mask.

26. The method of claim 22 wherein said mask comprises a phase-shifting mask.

27. The method of claim 22 wherein said mask comprises optical proximity correction.

28. The method of claim 22 wherein said mask comprises a reflective mask.

29. The method of claim 22 wherein said phase shift comprises 90 degrees.

* * * * *